United States Patent
Yu et al.

[19]

[11] Patent Number: 5,804,251
[45] Date of Patent: Sep. 8, 1998

[54] LOW TEMPERATURE ALUMINUM ALLOY PLUG TECHNOLOGY

[75] Inventors: Jick M. Yu, Beaverton; Vinay B. Chikarmane, Portland, both of Oreg.

[73] Assignee: Intel Corporation, Santa Clara, Calif.

[21] Appl. No.: 845,578

[22] Filed: Apr. 25, 1997

Related U.S. Application Data

[63] Continuation of Ser. No. 581,323, Dec. 29, 1995, abandoned.

[51] Int. Cl.$^6$ .................................................. C23C 16/00
[52] U.S. Cl. ..................... 427/250; 427/383.1; 427/404
[58] Field of Search ................................ 427/250, 383.1, 427/404

[56] References Cited

U.S. PATENT DOCUMENTS

| | | | |
|---|---|---|---|
| 5,108,951 | 4/1992 | Chen et al. | 437/187 |
| 5,356,836 | 10/1994 | Chen et al. | 437/194 |
| 5,423,939 | 6/1995 | Bryant et al. | 216/18 |
| 5,443,995 | 8/1995 | Nulman | 437/197 |
| 5,472,912 | 12/1995 | Miller | 437/194 |
| 5,486,492 | 1/1996 | Yamamoto et al. | 437/192 |
| 5,527,739 | 6/1996 | Parrillo et al. | 437/198 |

FOREIGN PATENT DOCUMENTS

| | | | |
|---|---|---|---|
| 1-76736 | 1/1986 | Japan | H01L 21/88 |

OTHER PUBLICATIONS

Paper Presented at SEMICON/Europe;Zurich, Mar. 1992, *Aluminum Contact–Hole Filing and Planarization*, J. Willer, H. Wendt and D. Emmer; pp. 1–8.

*Primary Examiner*—Benjamin Utech
*Attorney, Agent, or Firm*—Blakely, Sokoloff, Taylor & Zafman

[57] ABSTRACT

A method for forming an aluminum or aluminum alloy plug in the fabrication of a semiconductor device. An opening is formed in a wafer. A titanium wetting layer is then deposited over the wafer and lines the sidewalls and bottom of the opening. The opening is then filled with aluminum in two steps, both steps being performed at approximately the same temperature. The first aluminum deposition step is performed at a first (slower) deposition rate. The second aluminum deposition step is performed at the same temperature as the first deposition step but at a different (or second/faster) deposition rate until the opening is completely filled.

20 Claims, 3 Drawing Sheets

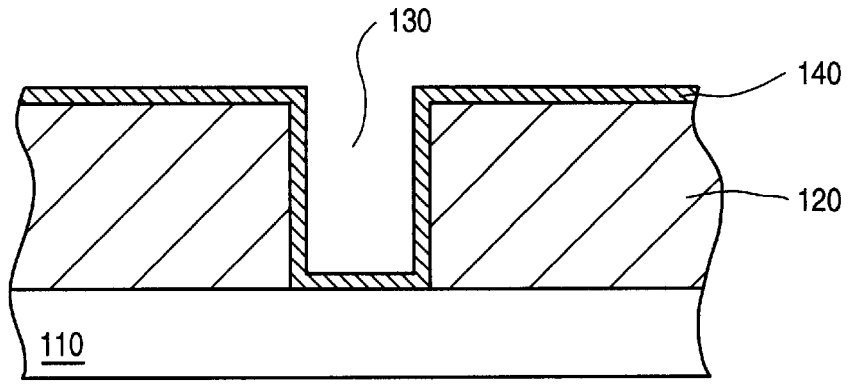
FIG_1A
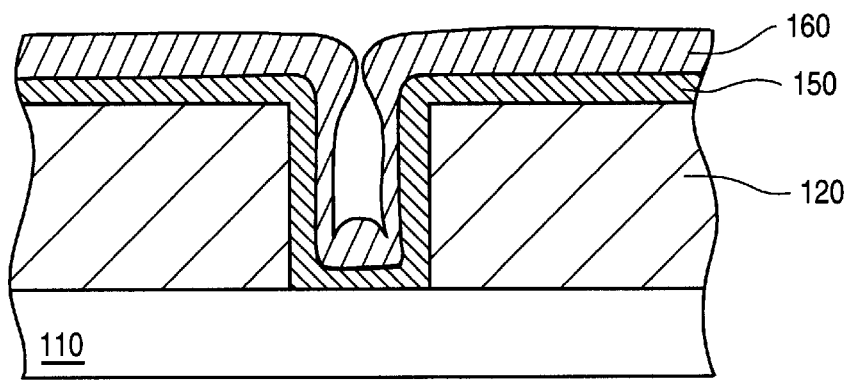
FIG_1B
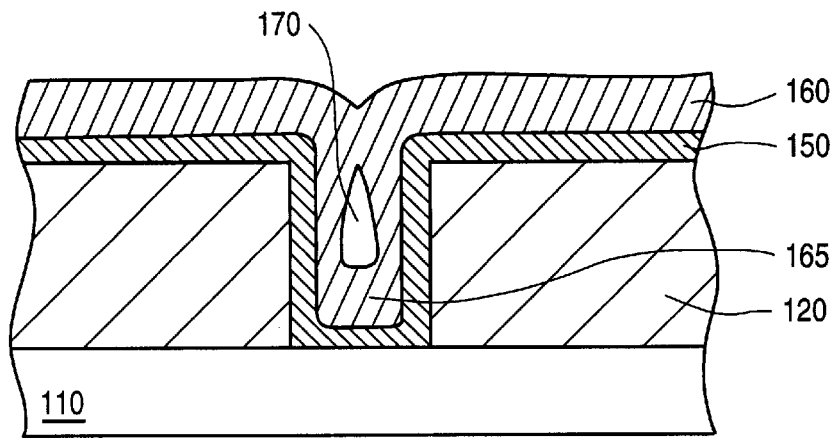
FIG_1C

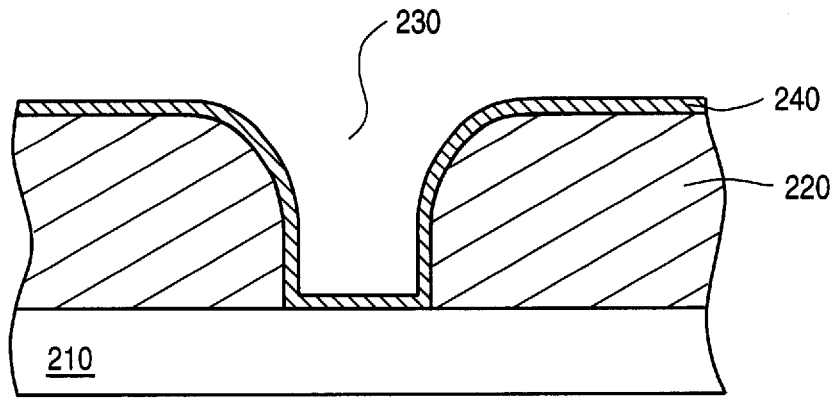
FIG_2A
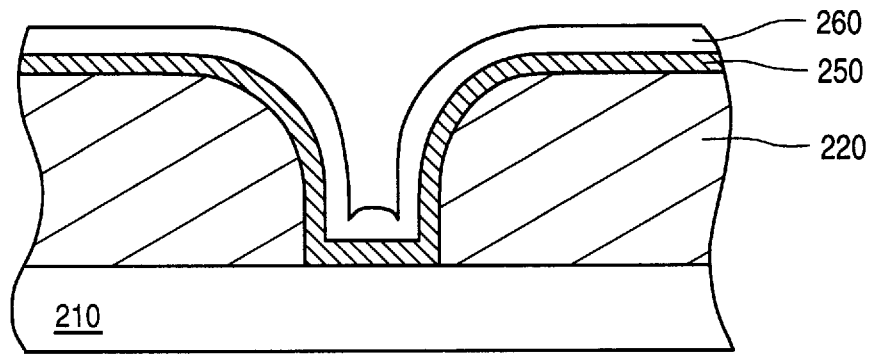
FIG_2B
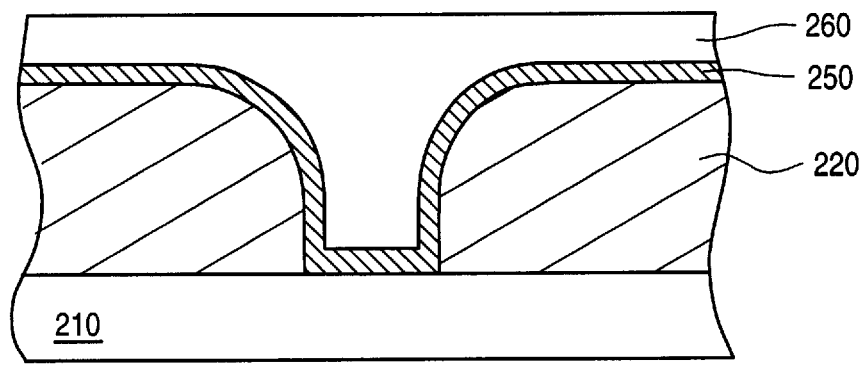
FIG_2C

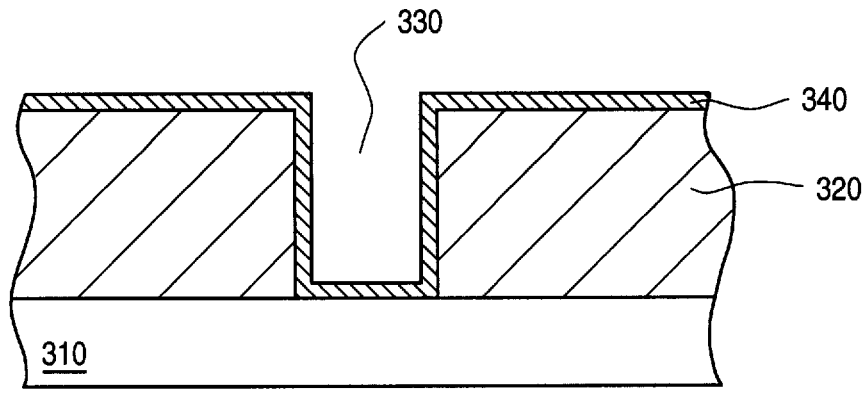
FIG_3A
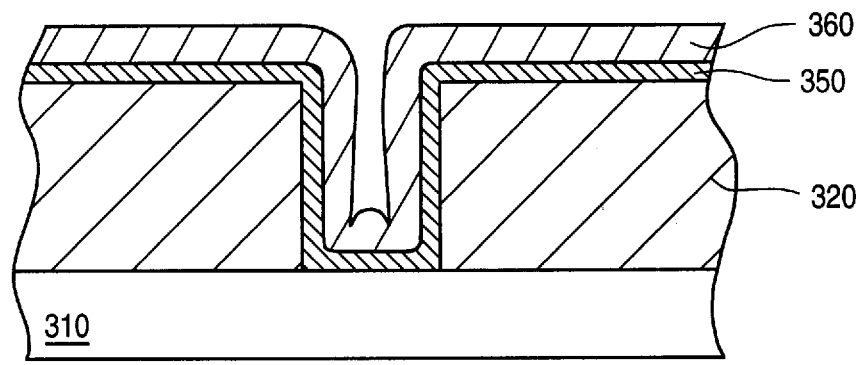
FIG_3B
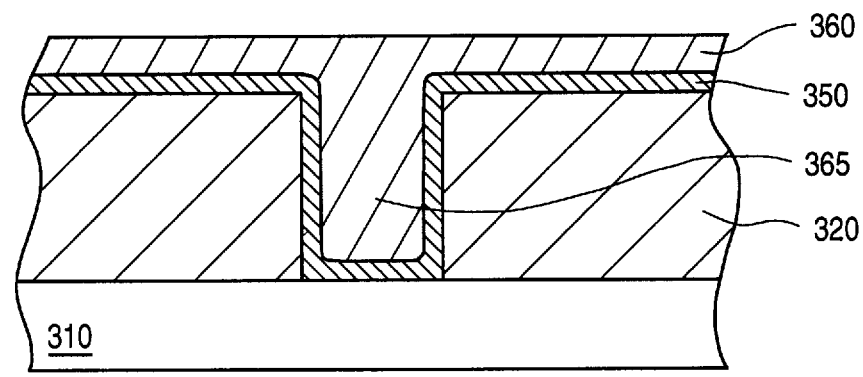
FIG_3C

LOW TEMPERATURE ALUMINUM ALLOY PLUG TECHNOLOGY

This is a continuation of application Ser. No. 08/581,323, filed Dec. 29, 1995, now abandoned.

BACKGROUND OF THE INVENTION

1. Field of the Invention

This invention relates to the field of semiconductor devices, and more specifically, to a process for forming aluminum alloy plugs in the fabrication of semiconductor devices.

2. Background Information

As semiconductor devices become smaller so must the conductive contacts, plugs, vias, and interconnect lines of those devices. Tungsten (W) plug technology is widely used in the fabrication of semiconductor devices. However, tungsten plug technology entails the use of expensive equipment and a large number of processing steps.

A low cost alternative to tungsten plug technology is the use of aluminum (Al) and aluminum alloys to fill plugs. Additionally, because aluminum can be sputter deposited and reflowed into the plug, it results in a metallization scheme with a significant reduction in the number of processing steps. However, as the dimensions of the vias decrease to less than 0.5 micron ($\mu$) in new generations of semiconductor devices, current methods for filling plugs with aluminum are also subject to the formation of holes or voids.

FIGS. 1a through 1c illustrate the problems associated with filling small openings in a semiconductor wafer using prior art methods of reflowing aluminum and aluminum alloys. FIG. 1a illustrates a cross-sectional view of a semiconductor wafer (wafer) having a dielectric layer 120 formed over a substrate 110. Opening 130 may be formed in dielectric layer 120 using standard photoresist and etch techniques.

A wetting layer 140, for example titanium (Ti), is deposited over the wafer and lines the sidewalls and bottom of opening 130. Wetting layer 140 helps to reduce the interfacial energy between the aluminum that is to be deposited and substrate 110 and/or dielectric layer 120. Wetting layer 140 also helps to reduce or avoid agglomeration between the aluminum that is to be deposited and substrate 110 and/or dielectric layer 120.

Typical prior art methods deposit the aluminum in two steps, a cold deposition step followed by a hot deposition step. In one prior art method an aluminum layer 160 is sputter deposited over wetting layer 140 during the cold deposition step and is reflowed into opening 130 during the hot deposition step, as is illustrated in FIG. 1b. At the relatively higher temperature for reflow, however, aluminum (Al) layer 160 reacts with titanium (Ti) wetting layer 140 and forms intermetallic (TiAl$_3$) compound layer 150. It should be noted however, that not all of aluminum layer 160 will react with titanium wetting layer 140 to form intermetallic (TiAl$_3$) compound layer 150. As soon as all the available titanium in titanium wetting layer 140 has reacted to form TiAl$_3$, the remaining aluminum being deposited forms aluminum layer 160 and the aluminum (Al) plug 165. FIG. 1c illustrates a cross-sectional view of a semiconductor wafer after opening 130 has been completely filled with aluminum.

One of the problems with using a cold and a hot depositon step is that the overhang of the low temperature aluminum layer tends to close or "pinch" the top of the opening, especially in small vias (i.e. less than 0.5 micron ($\mu$)), as is illustrated in FIG. 1b. Consequently, as is illustrated in FIG. 1c, the migration of aluminum (Al) into the opening during the high temperature aluminum fill may slow down, and cause a hole or void 170 to form in the plug 165. Void 170 may decrease the reliability of the circuit by reducing the conductance and reliability of the aluminum plug 165 or create an open circuit in the semiconductor device being fabricated.

Prior art methods for controlling void formation include, for example, forming openings in the semiconductor wafer with rounded edges, as illustrated in FIG. 2a. Since the edges of opening 230 formed in dielectric layer 220 are rounded, when aluminum layer 260 is sputter deposited and reflowed into opening 230, as is illustrated in FIG. 2b, the aluminum does not form overhangs and consequently does not pinch the top of opening 230. As illustrated in FIG. 2c, the remaining aluminum may be sputter deposited and reflowed into opening 230 without the formation of voids or holes.

One problem with forming openings with rounded edges, however, is that they require a larger area (or space) on the surface of the semiconductor device. As can be seen in FIG. 2b, the plug formed using the opening with rounded edges requires additional space on the wafer where a plug formed with vertical sidewalls requires less space on the wafer, as can be seen in FIG. 1c. Consequently this consideration weighs against the formation of smaller and/or more dense semiconductor devices.

Another prior art method for controlling void formation is described in Chen et al., U.S. Pat. No. 5,108,951, issued on Apr. 28, 1992. The process described in Chen et al. uses several process steps. In the first step of Chen et al. aluminum is sputter deposited on the wafer using a cold deposition technique (i.e. less than 350° C.). Next, or in the second step, Chen et al. heats the wafer. As the wafer in Chen et al. is warmed (heated) the aluminum deposited in the cold deposition step, gradually begins to reflow into the opening. Once the wafer in Chen et al. reaches a deposition temperature (i.e. approximately 450° C.) the remaining aluminum is deposited and reflowed into the opening until the opening is completely filled.

One problem with the method described in Chen et al. is that the time required, between the cold deposition step and the relatively hotter deposition step, to heat the wafer decreases the throughput of the system. Additionally, the cold-hot process of Chen et al. exhibits the problems of void formation, described above, in small vias, for example, less than 0.5 micron (<0.5$\mu$).

Thus, what is needed is a method for filling an opening having vertical sidewalls in a semiconductor device using a method that reduces or avoids the formation of voids, without the use of a cold deposition step but that allows the formation of relatively more dense and/or smaller semiconductor devices.

SUMMARY OF THE INVENTION

The present invention describes an improved process for forming an aluminum or aluminum alloy plug without the use of a cold deposition step in the fabrication of a semiconductor device. An opening is formed in a wafer. A titanium wetting layer is then deposited over the wafer and lines the sidewalls and bottom of the opening. A first aluminum deposition step is performed at a first deposition rate. A second aluminum deposition step is performed at the same temperature as the first deposition step but at a different (or second) deposition rate.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 1a illustrates a cross-sectional view of a semiconductor wafer after a titanium wetting layer has been deposited over the wafer.

FIG. 1b illustrates a cross-sectional view of the semiconductor wafer in FIG. 1a after an aluminum layer has been sputter deposited and reflowed over the wafer during a cold deposition step.

FIG. 1c illustrates a cross-sectional view of the semiconductor wafer in FIG. 1b after the remainder of the aluminum layer has been sputter deposited and reflowed over the wafer in a hot deposition step.

FIG. 2a illustrates a cross-sectional view of a semiconductor wafer wherein an opening with rounded edges has been formed.

FIG. 2b illustrates a cross-sectional view of the semiconductor wafer in FIG. 2a after an aluminum layer has been sputter deposited and reflowed over the rounded edges of the opening formed in the wafer.

FIG. 2c illustrates a cross-sectional view of the semiconductor wafer in FIG. 2b after the remainder of the aluminum layer has been sputter deposited and reflowed over the rounded edges of the opening formed in the wafer.

FIG. 3a illustrates a cross-sectional view of a semiconductor wafer after a titanium wetting layer has been deposited over the wafer.

FIG. 3b illustrates a cross-sectional view of the semiconductor wafer in FIG. 3a after an aluminum layer has been sputter deposited and reflowed over the wafer at a first deposition rate.

FIG. 3c illustrates a cross-sectional view of the semiconductor wafer in FIG. 3b after the remainder of the aluminum layer has been sputter deposited and reflowed over the wafer at a second deposition rate.

DETAILED DESCRIPTION

A Novel Low Temperature Aluminum Alloy Plug Technology is disclosed. In the following description, numerous specific details are set forth such as specific materials, process steps, process parameters, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

As stated above in the Background of the Invention, as semiconductor devices become smaller and more dense, so must the conductive contacts, plugs, vias, and interconnect lines of those devices. The present invention describes an improved process for forming conductive layers in a semiconductor wafer that reduces or avoids the formation of holes or voids in those conductive layers without the use of a cold deposition step. In the manufacture of semiconductor devices, and more specifically in the formation of conductive (metal) layers, the present invention may be employed when filling openings (or vias) that have vertical sidewalls and/or small dimensions, for example, dimensions less than 0.5 micron ($\mu$). The present invention helps to maintain the electrical conductance of the metal layer and avoid the formation of open circuits, thus improving the reliability of the semiconductor device.

It is to be noted that although the present invention is described in conjunction with the formation of aluminum alloy plugs, the present invention may be used in the formation of many different types of conductive layers, for example: contacts, interconnect lines, etc. It should also be noted that although the present invention is described and depicted (in the Figures) as being used for openings (or vias) formed in a dielectric layer located directly above the substrate, the present invention may be used in vias which are formed in other materials and/or on other levels of a semiconductor wafer. Thus, the description and figures of the present invention are merely illustrative and are not intended to limit the scope of the invention. It will be appreciated that the broader spirit and scope of the present invention, as set forth in the appended claims, may be applied to any conductive layer which seeks the advantages of the present invention.

Additionally, it is to be noted that the term semiconductor wafer is used throughout the present disclosure. Semiconductor wafer is used to refer to a silicon semiconductor substrate or a part thereof, such as gallium arsenide, upon which device layers have been or are going to be formed. It should also be noted that the term substrate includes but is not limited to: fully processed, semi-processed, or unprocessed substrates with semiconductor materials thereon.

The general processing steps used in the manufacture of semiconductor devices, for example the formation of vias, are well known in the art and will be obvious to one with ordinary skill in the art, therefore, these steps are not described in detail. FIG. 3a illustrates an opening formed in a semiconductor wafer (or substrate). Opening 330 is formed using standard photoresist and etch techniques such that opening 330 has vertical sidewalls and dimensions of less than 0.5 micron ($\mu$). Opening 330 is illustrated such that it is formed in dielectric layer 320 and directly above substrate 310; however, it will be obvious to one with skill in the art that opening 330 may be formed in other materials and/or on other levels of the semiconductor wafer (or substrate).

Wetting layer 340 has been deposited over the semiconductor wafer (wafer) and lines the sidewalls and bottom of opening 330. In one currently preferred embodiment a titanium (Ti) wetting layer is used. It should be noted and it will be obvious to one with ordinary skill in the art that other wetting layers, for example: titanium nitride, titanium aluminide, etc. may also be used. As previously described in the Background of the Invention, wetting layer 340 helps to reduce the interfacial energy between the aluminum that is to be deposited and substrate 310 and/or dielectric layer 320. Wetting layer 340 also helps to reduce or avoid agglomeration between the aluminum that is to be deposited and substrate 310 and/or dielectric layer 320.

Once wetting layer 340 has been deposited then opening 330 may be filled with aluminum. Rather than deposit and reflow the aluminum in two steps, at two temperatures (i.e. cold and hot deposition), as previously done in the prior art, the present invention deposits the aluminum in two steps, but at the same temperature, (i.e. without a cold deposition step) and at different deposition rates.

FIG. 3b illustrates the early stages of the first deposition step. In the first deposition step, aluminum is sputter deposited and reflowed into opening 330. The first deposition step of the present invention is performed at a temperature in the range of approximately 350°–500° C. The aluminum deposition rate of the first deposition step is a lower rate than used in the second deposition step. The first deposition rate is in the range of approximately 20–100 angstroms per second (Å/sec) and is performed until approximately 2000–9000 Å of aluminum is deposited on the wafer. In one currently preferred embodiment the first deposition rate is approximately 35–40 Å/sec and is performed until approximately 9000 Å of aluminum is deposited during the first deposition step.

During the first deposition step the aluminum reacts with wetting layer 340 and forms an intermetallic compound layer 350. In one currently preferred embodiment a titanium aluminide ($TiAl_3$) intermetallic compound layer is formed. The lower deposition rate and the high temperature of the first deposition step allows the aluminum to flow more evenly into opening 330, thus aluminum layer 360 (formed using the present invention) forms minimal "overhangs" and delays the pinching of the top of opening 330 thereby leaving little or no void. It should be noted and it will be obvious to one with ordinary skill in the art that small voids such as those that may be left with the present invention may be sealed using "bulk diffusion." Bulk diffusion is commonly known in the art and therefore is not described herein in detail.

The second deposition step of the present invention is performed at approximately the same temperature as the first deposition step. Because the temperature of both steps are the same only a single process chamber need be used. Using a single process chamber decreases the cost and decreases the amount of time required to fabricate the metal layer. Also, because the temperature of both steps are the same (i.e. approximately 350°–500° C.) the present invention avoids the use of a cold deposition step. Thus, the wafer and the aluminum are already at an appropriate temperature for reflow in the present invention. Because there is no delay between the deposition steps of the present invention, waiting for the wafer and/or aluminum to reach the appropriate temperature for reflow, the throughput of the system utilizing the present invention may be increased.

The aluminum in the second deposition step is sputter deposited and reflowed at a higher deposition rate than in the first deposition step. The second deposition rate is in the range of approximately 100–300 Å/sec and is performed until approximately 3000–10,000 Å of aluminum is deposited on the wafer. In one currently preferred embodiment the second deposition rate is approximately 140–160 Å/sec and is performed until approximately 8850 Å of aluminum is deposited during the second deposition step. The second deposition step is performed until opening 330 is completely filled, as is illustrated in FIG. 3c.

Since aluminum layer 360 forms minimal overhangs in the first deposition step, the migration of aluminum (Al) in the second deposition step is not affected and little or no voids are formed in the plug 365. Because little or no voids (or holes) are formed, the reliability of the aluminum plug 365 and hence of the semiconductor device manufactured using the present invention is improved. Additionally, since the present invention allows the deposition and reflow of aluminum without the formation of overhangs, the present invention allows the use of openings with smaller dimensions and vertical sidewalls, thus allowing for the fabrication of smaller and/or more dense semiconductor devices. Thus, as the dimensions of the vias decrease to less than 0.5 micron ($\mu$) in new generations of semiconductor devices, the present invention offers a method for filling plugs with aluminum without the formation of holes or voids.

It should be noted and it will be obvious to one with ordinary skill in the art, that the present invention may be performed in only a single deposition step at the lower deposition rate. However, because it would take a longer amount of time to completely fill the opening at the lower deposition rate the throughput of the system would substantially decrease. Therefore, it is advantageous to perform the method of the present invention in two steps such that the second deposition rate is faster than the first, thereby increasing the throughput of the system.

It will also be obvious to one with ordinary skill in the art, that the ranges of aluminum deposited may vary depending upon the size/dimension of the opening formed in the semiconductor wafer. Additionally, it will be obvious to one with ordinary skill in the art that although the present invention is described in relation to openings of smaller than approximately $0.5\mu$, the present invention may also be used to fill openings of larger dimensions if desired.

While the present invention is described in relation to the formation of aluminum and aluminum alloy plugs, it will be obvious to one with ordinary skill in the art that the present invention may be useful in the formation of other metal layers on a semiconductor wafer, for example: contacts, interconnect lines, etc. Additionally, it should be noted and it will be obvious to one with ordinary skill in the art, that although the present invention is described with reference to aluminum and aluminum alloys, the present invention may also be utilized with respect to other metals with the proper selection of wetting layer material and temperature for use with that particular metal's characteristics.

Thus, A Novel Aluminum Alloy Plug Technology has been described. Although specific embodiments, including specific dimensions, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A process for forming a plug comprising:

forming an opening in a substrate, said opening having vertical sidewalls;

depositing a wetting layer on the sidewalls and bottom of said openings; and filling said opening, wherein said opening is first lined with said wetting layer and the remaining portion of said opening is then completely filled with aluminum and, wherein said step of completely filling said opening with aluminum includes:

performing a first aluminum deposition step, wherein said first aluminum deposition step is performed at a first deposition rate and wherein the aluminum of the first aluminum deposition step flows into the bottom and along the sidewalls of said opening; and performing a second aluminum deposition step, wherein said second aluminum deposition step is performed at a second deposition rate, wherein said first deposition rate is less than said second deposition rate and, wherein said second deposition step completes the filling of said opening, and wherein said first and second deposition steps are performed at approximately the same temperature.

2. The process as described in claim 1 wherein said wetting layer comprises titanium.

3. The process as described in claim 1 wherein said wetting layer is deposited at a temperature in the range of approximately 350°–500° C.

4. The process as described in claim 1 wherein said first deposition rate is approximately 20–100 Å/second.

5. The process as described in claim 1 wherein said first aluminum deposition step is performed until approximately 2000–9000 Å of aluminum has been deposited.

6. The process as described in claim 1 wherein said second deposition rate is approximately 100–300 Å/second.

7. The process as described in claim 1 wherein said second aluminum deposition step is performed until approximately 3,000–10,000 Å of aluminum has been deposited.

8. The process as described in claim 1 wherein said first and said second depositon steps are performed in the same deposition chamber and at a temperature in the range of approximately 350°–500° C.

9. A process for forming a plug comprising:

forming an opening in a substrate, said opening having vertical sidewalls;

depositing a wetting layer on the sidewalls and bottom of said opening; and filling said opening, wherein said opening is first lined with said wetting layer and the remaining portion of said opening is then completely filled with aluminum and, wherein said step of completely filling said opening with aluminum includes:

performing a first aluminum deposition step, wherein said first aluminum deposition step is performed at a first deposition rate and wherein the aluminum of the first aluminum deposition step flows into the bottom and along the sidewalls of said opening; and performing a second aluminum deposition step, wherein said second aluminum deposition step is performed at a second deposition rate; wherein said first and second deposition steps are performed at approximately the same temperature, wherein said first deposition rate is less than said second deposition rate and, wherein said second deposition step completes the filling of said opening.

10. The process as described in claim 9 wherein said wetting layer comprises titanium.

11. The process as described in claim 10 wherein said wetting layer is deposited at a temperature in the range of approximately 350°–500° C.

12. The process as described in claim 9 wherein said first deposition rate is approximately 20–100 Å/second.

13. The process as described in claim 9 wherein said first aluminum deposition step is performed until approximately 2000–9000 Å of aluminum has been deposited.

14. The process as described in claim 9 wherein said second deposition rate is approximately 100–300 Å/second.

15. The process as described in claim 9 wherein said second aluminum deposition step is performed until approximately 3,000–10,000 Å of aluminum has been deposited.

16. The process as described in claim 9 wherein said first and said second depositon steps are performed in the same deposition chamber and at a temperature in the range of approximately 350°–500° C.

17. A process for forming a plug comprising:

forming an opening in a substrate, said opening having vertical sidewalls;

depositing a wetting layer on the sidewalls and bottom of said opening; and filling said opening, wherein said opening is first lined with said wetting layer and the remaining portion of said opening is then completely filled with aluminum and, wherein said step of completely filling said opening with aluminum includes:

performing a first aluminum deposition step, wherein said first aluminum deposition step is performed at a first deposition rate of approximately 20–100 A/second until approximately 2000–9000 A of aluminum has been deposited and wherein the aluminum of the first aluminum deposition step flows into the bottom and along the sidewalls of said opening; and performing a second aluminum deposition step, wherein said second aluminum deposition step is performed at a second deposition rate of approximately 100–300 A/second until approximately 3,000–10,000 A of aluminum has been deposited and, wherein said second deposition step completes the filling of said opening, and wherein said first and second deposition steps are performed at approximately the same temperature.

18. The process as described in claim 17 wherein said wetting layer comprises titanium.

19. The process as described in claim 18 wherein said wetting layer is deposited at a temperature in the range of approximately 350°–500° C.

20. The process as described in claim 17 wherein said first and said second depositon steps are performed in the same deposition chamber and at a temperature in the range of approximately 350°–500° C.

* * * * *